United States Patent
Sas et al.

(10) Patent No.: US 6,854,181 B2
(45) Date of Patent: Feb. 15, 2005

(54) FOLDED-FIN HEAT SINK ASSEMBLY AND METHOD OF MANUFACTURING SAME

(75) Inventors: Adrian Pieter Sas, Kitchener (CA); Kevin O'Neil, Cambridge (CA); Robert Bamsey, Lynden (CA)

(73) Assignee: Tyco Electronics Canada Ltd., Markham (CA)

( * ) Notice: Subject to any disclaimer, the term of this patent is extended or adjusted under 35 U.S.C. 154(b) by 143 days.

(21) Appl. No.: 10/157,107

(22) Filed: May 30, 2002

(65) Prior Publication Data

US 2002/0179285 A1 Dec. 5, 2002

Related U.S. Application Data

(60) Provisional application No. 60/294,017, filed on May 30, 2001.

(51) Int. Cl.[7] ................................................ B23P 15/00
(52) U.S. Cl. .................................. 29/890.3; 29/428
(58) Field of Search ............................. 29/840.3, 428; 165/80.3, 121, 122, 185; 361/647, 704; 257/722; 174/16.3

(56) References Cited

U.S. PATENT DOCUMENTS

| | | | |
|---|---|---|---|
| 5,335,722 A | 8/1994 | Wu | |
| 5,494,098 A | 2/1996 | Morosas | |
| 5,594,623 A | 1/1997 | Schwegler | |
| 5,664,624 A | 9/1997 | Tsai et al. | |
| 5,706,169 A | 1/1998 | Yeh | |
| 5,828,550 A | 10/1998 | Horng | |
| 6,062,301 A | 5/2000 | Lu | |
| 6,135,200 A | 10/2000 | Okochi et al. | |
| 6,269,003 B1 | 7/2001 | Wen–Chen | |
| 6,343,013 B1 | 1/2002 | Chen | |
| 6,373,699 B1 | 4/2002 | Chen | |
| 2001/0009187 A1 | 7/2001 | Lin | |
| 2002/0003690 A1 | 1/2002 | Lin et al. | |

FOREIGN PATENT DOCUMENTS

| | | |
|---|---|---|
| EP | 0124428 | 11/1984 |
| GB | 2316804 | 3/1998 |
| WO | WO 98/44554 | 10/1998 |

OTHER PUBLICATIONS

"Intel® Pentium® 4 Processor in the 478–Pin Package Thermal Design Guidelines" Design Guide, Jan. 2002, Document No.: 249889–002.

*Primary Examiner*—Irene Cuda Rosenbaum
(74) *Attorney, Agent, or Firm*—R. Craig Armstrong; Borden Ladner Gervais L.L.P.

(57) ABSTRACT

A method of assembling a folded-fin heat sink assembly, the assembly including base plate, a folded fin-assembly and a shroud, includes positioning the folded-fin assembly on a base plate, placing the shroud over the folded-fin assembly, urging the shroud to press the folded-fin assembly against the baze plate and bonding attached to the base plate and a shroud. According to an embodiment, the resulting shroud of the folded-fin assembly acts as extension of the folded-fin heat sink providing additional fin surfaces via which heat can be dissipated.

16 Claims, 7 Drawing Sheets

FOLDED-FIN HEAT SINK ASSEMBLY AND METHOD OF MANUFACTURING SAME

This application claims the benefit of provisional application Ser. No. 60/294,017, filed May 30, 2001.

FIELD OF THE INVENTION

The present invention relates to a folded-fin heat sink assembly for use as a cooling solution in micro-electronics and/or telecommunication applications. In particular, the present invention relates to a cost effective method of fabrication of a folded-fin heat sink assembly in which a series of heat sink components comprising the assembly may be fixtured in order to facilitate a low cost post processing joining operation, such as brazing, soldering or thermally conductive epoxy bonding.

BACKGROUND OF THE INVENTION

Integrated circuit devices are increasingly being used in modern electronic applications such as computers. During normal operation, integrated circuit devices generate significant amounts of heat. If this heat is not continuously removed, the device may overheat resulting in damage to the device and/or a reduction in operating performance. As a general rule, the performance of integrated circuit devices is likely to improve when they are operated at lower temperatures. Hence, heat sink solutions which facilitate a lower integrated circuit operating temperature have an economic value over heat silk solutions offering higher integrated circuit operating temperatures.

Over the years, there has been a trend toward increases in the number of transistors and therefore capacitance within the integrated circuit; in turn, there has also been a trend towards increased clock frequency speeds of integrated circuit devices. These two trends have resulted in a proportional increase in the power used by the integrated circuit. Consequently, the heat generated by these devices has also increased. In order to adequately cool these high powered integrated circuit devices, heat sinks with greater cooling capacities have evolved.

Historically within the microprocessor industry, the majority of heat sink solutions have used aluminum extrusions. In aluminum extrusions, surface area aspect ratios are typically limited to a maximum ratio of 12:1.

In today's marketplace, with microprocessor solutions being offered in the 1.7 GHz clock frequency range, cooling requirements often cannot be met by the technical capabilities offered by aluminum extrusion technology. An increasingly common solution to this problem is folded-fin technology, with its low thickness range (0.004"–0.040") and tight fin density capabilities which offer heat sink aspect ratios which can approach 40:1 and correspondingly larger surface areas for heat dissipation.

A typical folded-fin heat sink assembly comprises a base plate and a folded-fin assembly mounted on top of the base plate, the folded-fin assembly having a plurality of joined folded-fins extending upwardly from the base plate. A shroud may also be provided surrounding a substantial portion of the folded-fin assembly. The folded-fin assembly is produced by feeding strip aluminum or copper material through a set of blades which are actuated through cam action to produce its accordion-like structure.

Typically the base plate and the folded-fin assembly are made of materials which have a high thermal conductivity; materials such as aluminum (approximately 200 W/mK) or copper (approximately 400 W/mK) and, in some cases, these two components comprise the heat sink in its totality.

The presence of a shroud is desirable for a number of reasons, notable among which is that it can function as:

i) a device for capturing and supporting other required components of the assembly (e.g. spring clip attachment devices for attaching the heat sink to a support structure), ii) a means for securing and supporting other required components (e.g. a cooling fan assembly), iii) a means for ducting the heat sink airflow passage, thereby ensuring that the heated air does not rise and leave the heat sink prematurely, thereby decreasing its effectiveness, iv) a means for protecting the potentially fragile nature of the folded-fin heat sink from being damaged during handling.

In these typical applications, the shroud may be made from non-thermally conductive materials such as plastic, and is typically attached to the heat sink in an operation which is downstream of the post-processing joining operation of securing the fins to the base by brazing, soldering, or epoxy bonding. As a general rule, the shroud in these typical applications is not a functional part of the thermal heat sink solution.

In the above-described typical folded-fin heat sink, special precautions must be taken in order to reduce the tendency of the fins to move or float in a random manner on the liquidus interface between the fins and the base plate, created in the post processing joining operation, which can lead to the problem of individual fins potentially being joined together. This results in an aesthetically displeasing visual component and, more importantly, results in a component which has a significant reduction in its potential thermal performance. Special precautions to avoid such a condition might typically include, for example:

i) the use of special fixturing during the process step, ii) the use of additional and expensive components attached to the heat sink which act as a fixturing/separating device, and iii) special upstream operations such as discrete laser welding of individual fins.

However, such special precautions are often undesirable, for the following reasons:

(i) they may result in significant additional capital expenditure, (ii) they may result in additional component cost and weight, (iii) they may result in adding significant unit processing weights through post processing joining operations (i.e. joining the fins to the base plate), which entail heating the overall mass up to a required temperature, and therefore can reduce process throughput significantly, and (iv) they may result in additional labor associated with the loading and unloading of components into specialized brazing fixtures or specialized laser welding fixtures.

It is therefore desirable to provide a low cost, mass-producible folded-fin heat sink assembly which thermally exceeds the capabilities of aluminum extrusion technology, and assists in meeting the present marketplace needs.

SUMMARY OF THE INVENTION

It is an object of the present invention to provide a folded-fin heat sink assembly solution which obviates or mitigates the disadvantages of known solutions as discussed above.

In a first aspect, the present invention provides a method of manufacturing a folded-fin heat sink assembly, comprising:

positioning a folded-fin assembly on a base plate;

placing a shroud over a substantial portion of the folded-fin assembly with at least part of the shroud engaging the folded-fin assembly;

urging the shroud towards the base plate to press the folded-fin assembly against the base plate so as to avoid floating of the fins relative to the base plate and relative to each other and securing the shroud to the base plate whilst maintaining the folded-fin assembly under pressure; and bonding the folded-fin assembly to the base plate.

According to a further aspect of the present invention, there is provided a folded-fin heat sink assembly comprising a folded-fin assembly located upon and bonded to a base plate and a shroud located over a substantial portion of the folded-fin assembly and secured to the base plate with at least part of the shroud engaging the folded-fin assembly and maintaining the folded-fin assembly under pressure against the base plate.

In a presently preferred embodiment, the shroud is formed of a thermally conductive material, such as aluminum, copper or a plastic (including composite materials), which also undergoes the post process joining operation (i.e. brazing, soldering or conductive epoxy bonding) by joining the fins to the shroud, the shroud then acting as an extension of the folded-fin heat sink by providing additional fin surfaces via which heat may be dissipated.

In a further presently preferred embodiment, the shroud includes at least top and side panels, the side panels being secured to the base plate and the top panel having means extending inwardly therefrom engaging the folded-fin assembly to maintain the folded-fin assembly under pressure against the base plate. Preferably, such means comprises downwardly extending flaps extending transversely over at least a part of the top panel between the side panels.

In yet a further preferred embodiment, the top panel is provided with opposed edges extending transversely between the side panels and provided with one or more downwardly extending flanges extending therealong and capturing the folded-fin assembly between such flanges to locate the folded-fin assembly on the base plate.

In yet a further preferred embodiment, the side panels are provided with inwardly extending stop members adapted to engage the base plate and to limit the amount of pressure exerted by the shroud upon the folded-fin assembly by limiting the extent of movement of the shroud towards the base plate.

In yet a further preferred embodiment, the shroud is a multiple-part construction, at least two of such parts having spaced coplanar side walls, and the heat sink assembly is provided with clip attachment devices for attaching the heat sink assembly to a support structure, such clip attachment devices being supported by and captured between the spaced side walls.

The invention may be used in conjunction with an integrated fan. Conveniently, the top panel of the shroud has cut-out for passage of air flow from the fins and the fan is mounted on the top panel in registry with the cut-out. In conjunction with the heat sink assembly, the fan provides an active cooling device with impingement airflow primarily, which is especially useful for cooling integrated circuits during operation. Alternatively, the folded-fin heat sink assembly of the invention may be used in conjunction with a detached fin or blower unit, creating a passive cooling device with air flowing parallel to the fin direction.

BRIEF DESCRIPTION OF THE DRAWINGS

Preferred embodiments of the present invention will now be described, by way of example only, with reference to the attached Figures, wherein.

DETAILED DESCRIPTION OF THE INVENTION

Figure 1:
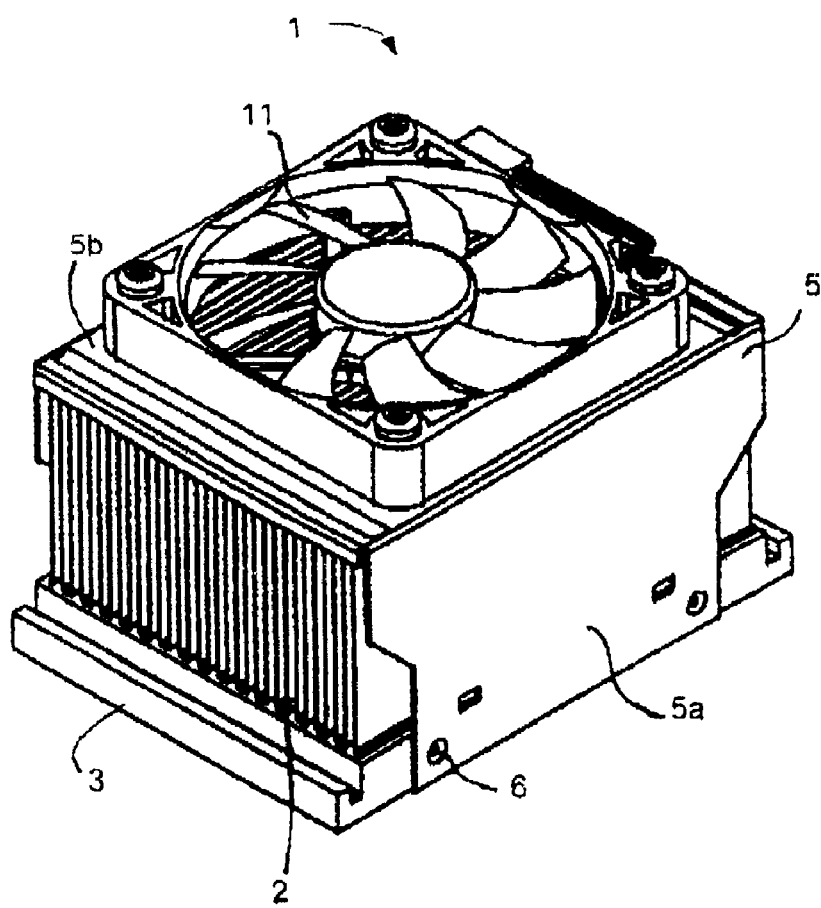
FIG. 1 is a front perspective view of an active folded-fin heat sink assembly construction with a singular folded-fin component and a singular shroud.
Figure 2:
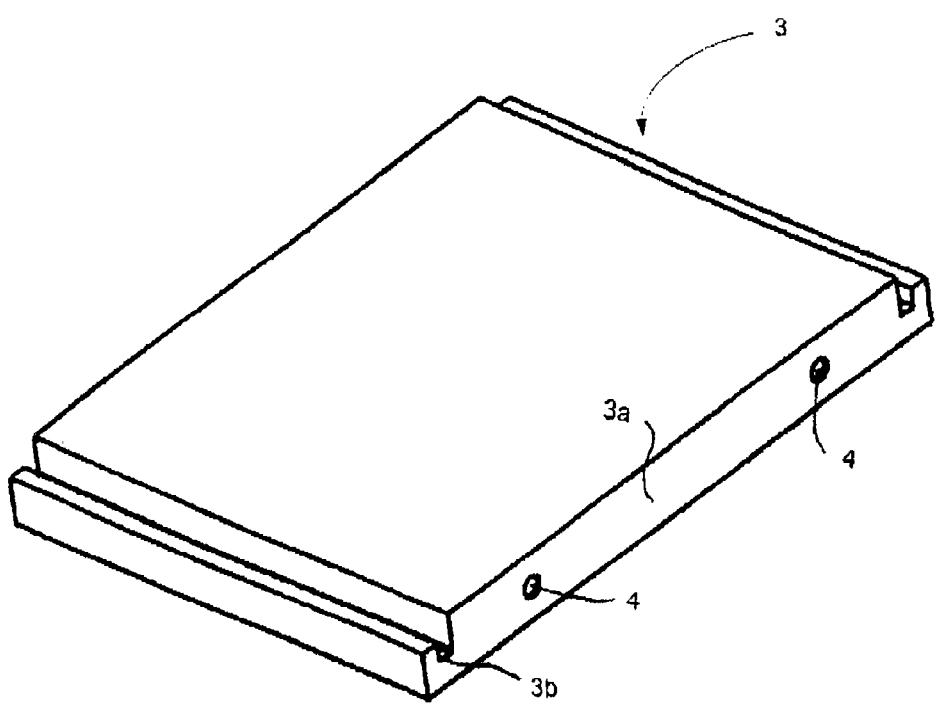
FIG. 2 is the base plate component in FIG. 1 prepared for shroud fixturing prior to the heat sink assembly process.

FIG. 1 shows a folded-fin heat sink assembly 1, having folded-fin assembly 2 located on a base plate 3. The folded-fin assembly 2 is secured to the base plate 3 by brazing, soldering or conductive epoxy bonding. A shroud 5, and in some instances a thermally conductive intermediate joining material such as a braze shim, a braze clad, a solder shim or a conductive epoxy, the shroud 5 having side walls 5a and a top wall 5b is located over the folded-fin assembly 2. The shroud is secured to the base plate 3 by means of inwardly locking dimples or projections 6 formed in the shroud side walls (see also FIG. 3), which engage with complementary locking holes 4 formed in the opposed edges 3a of the base plate 3 (see also FIG. 2). An alternate means of joining the shroud and joining material to the base plate may also be through a plurality of laser tack welds along the interface perimeter.

The base plate 3 typically is constructed from copper or aluminum materials and may subsequently be further processed to incorporate surface treatments such as nickel plating. It is manufactured in a variety of forms which can encompass sawcut extrusions, sawcut plate material or fine-blanked stamped components, for example. Some additional post machining processes may be incorporated in order to embody the necessary interface or attachment features, such as the grooves 3b, that are generally customer specific in nature. In preparation for the shroud attachment, the base plate is drilled in order to create locking holes 4. Locking dimples or projections 6 engage the locking holes 4 when the shroud is positioned over the folded-fin assembly.

Figure 3:
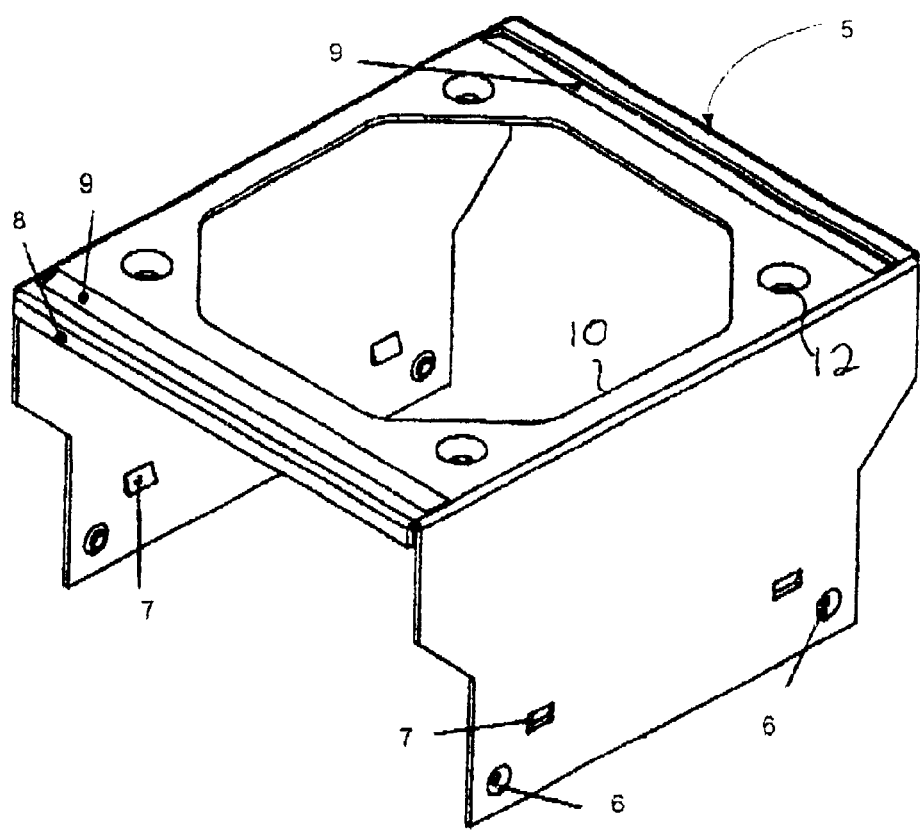
FIG. 3 is the shroud in FIG. 1 prepared for fixturing prior to the heat sink assembly process.

The shroud 5 is typically constructed from copper or aluminum materials. It is manufactured using a conventional stamping process, or alternately using a combination of a turret press punching operation, and a subsequent bending operation, or by any other desired means. If desired, the shroud top wall 5b may be provided with an appropriate pattern of cur-outs and holes for fastening ancillary components. In FIG. 3, the top wall 5b is provided with a cut-out 10 for accommodating a cooling fan 11 as shown in FIG. 1, and holes 12 for accommodating fasteners such as screws or rivers securing the fan to the shroud.

The heat sink is assembled by placing the folded-fin assembly 2 on the base plate 3. At this point, no attempt is made to fasten the folded-fin assembly to the base plate. The shroud 5 is then placed over the folded-fin assembly and attached to the base plate by engagement between the holes and dimples 4, 6.

The shroud also has inwardly extending tabs 7 which engage the top surface of the base plate 3 to provide z-coordinate height control for the shroud 5, and to act as a stop during the shroud attachment step. Downwardly extending flanges 8 located fore and aft of the shroud top wall 5b provides y-coordinate positional control and location for the captured folded-fin assembly 2, ensuring its proper relative position in the final heat-sink assembly 1. Downwardly extending flaps 9 extend across the shroud top wall 5b and are dimensioned so as to engage and press down upon the top edges of the folded-fin assembly 2 to ensure that a downward force is applied to the individual folded-fins sufficient to prevent undesirable movement such as flotation of the fins, which could result in potential failure of the device to be cooled by the heat sink caused by the fins bonding or wicking together. The flaps also ensure that the first set of fins is spaced appropriately from the shroud during the post process joining operation and that the fins are in contact with the base plate before the post process joining operation.

Once the shroud is in place upon the base plate, with the folded-fin assembly 2 captured between the shroud and the base plate, the post process joining operation is performed by use of a suitable technique such as brazing, soldering or conductive epoxy bonding. A further joining technique which may be employed is as described in our co-pending application Ser. No. 60/268,414.

Figure 4:
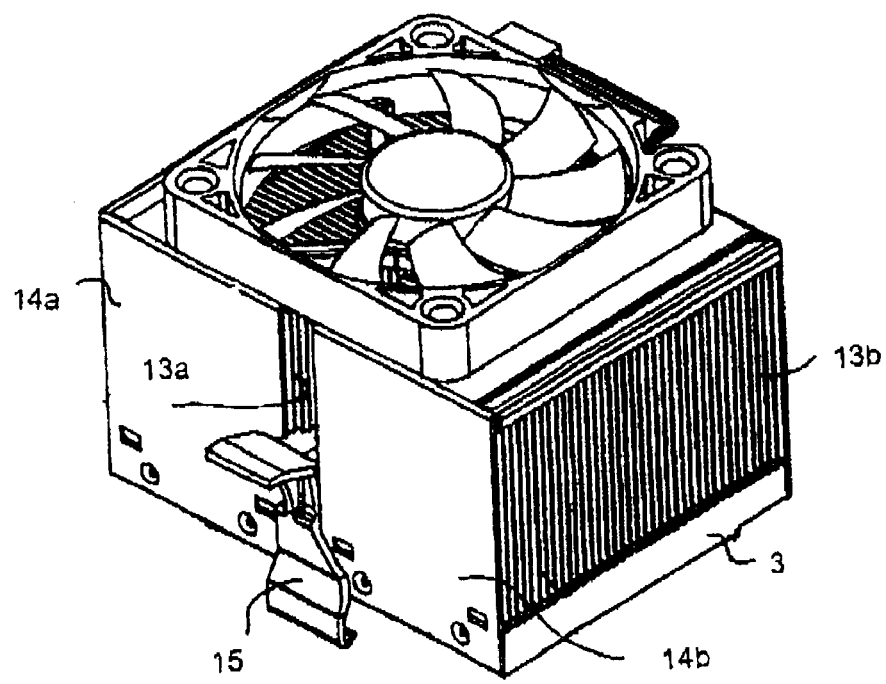
FIG. 4 is a front perspective view of an alternate embodiment of an active folded-fin heat sink assembly construction with a two piece folded-fin component and two piece shroud with a clip attachment device incorporated therein.
Figure 7:
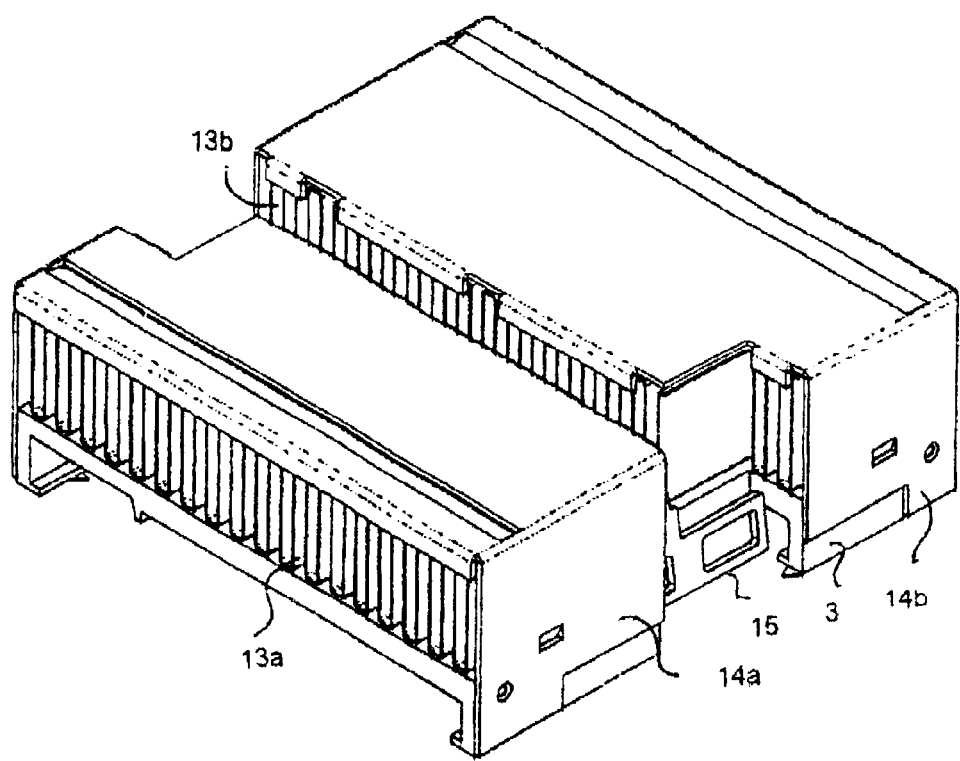
FIG. 7 is a front perspective view of an alternate embodiment of a passive folded-fin heat sink assembly construction with a dual folded-fin component and a two piece shroud with a captured clip attachment device incorporated.

FIGS. 4 and 7 show alternative embodiments of the invention wherein a two-piece folded-fin assembly comprising pieces 13a and 13b and a two-piece shroud comprising pieces 14a and 14b are located on a single base plate 3. Clips 15 for attaching the heat-sink assembly 1 to a suitable support structure (not shown) are captured between the opposed edges of the two-piece shroud 14a/14b.

Figure 5:
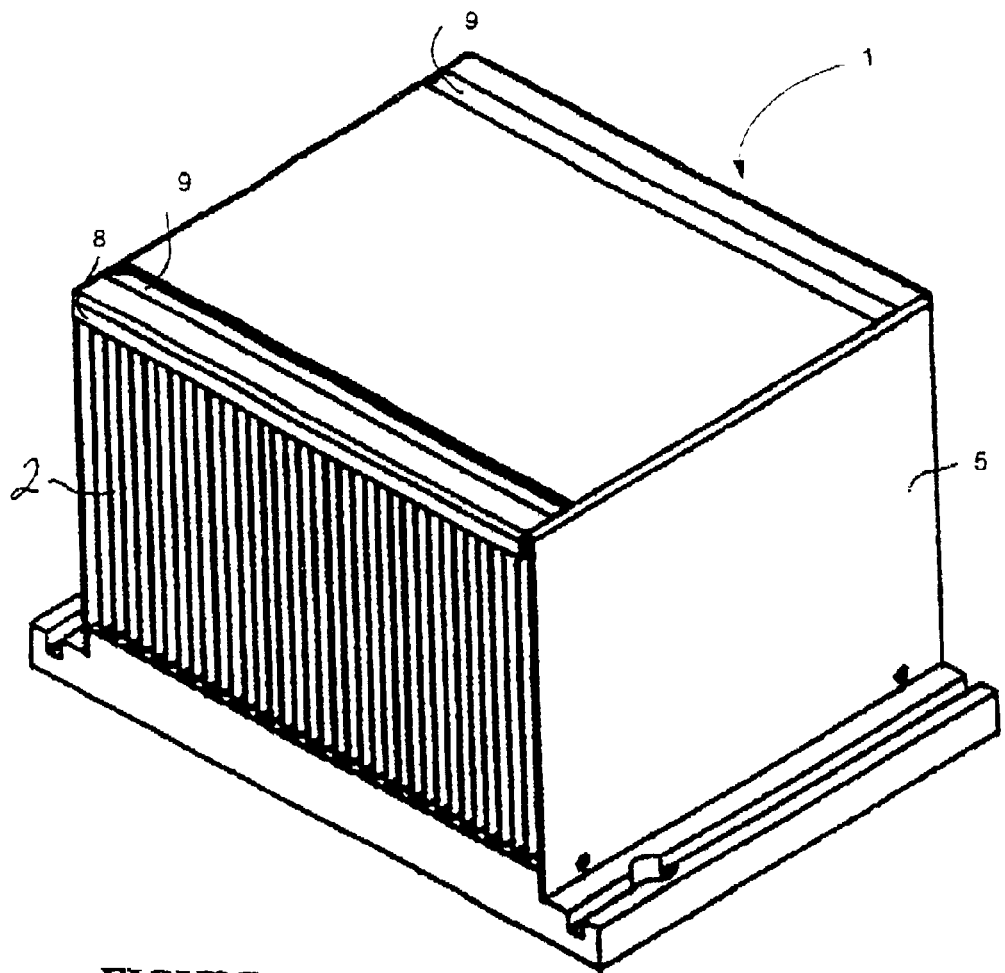
FIG. 5 is a front perspective view of a passive folded-fin hear sink assembly with a singular folded-fin component and a singular shroud construction.
Figure 6:
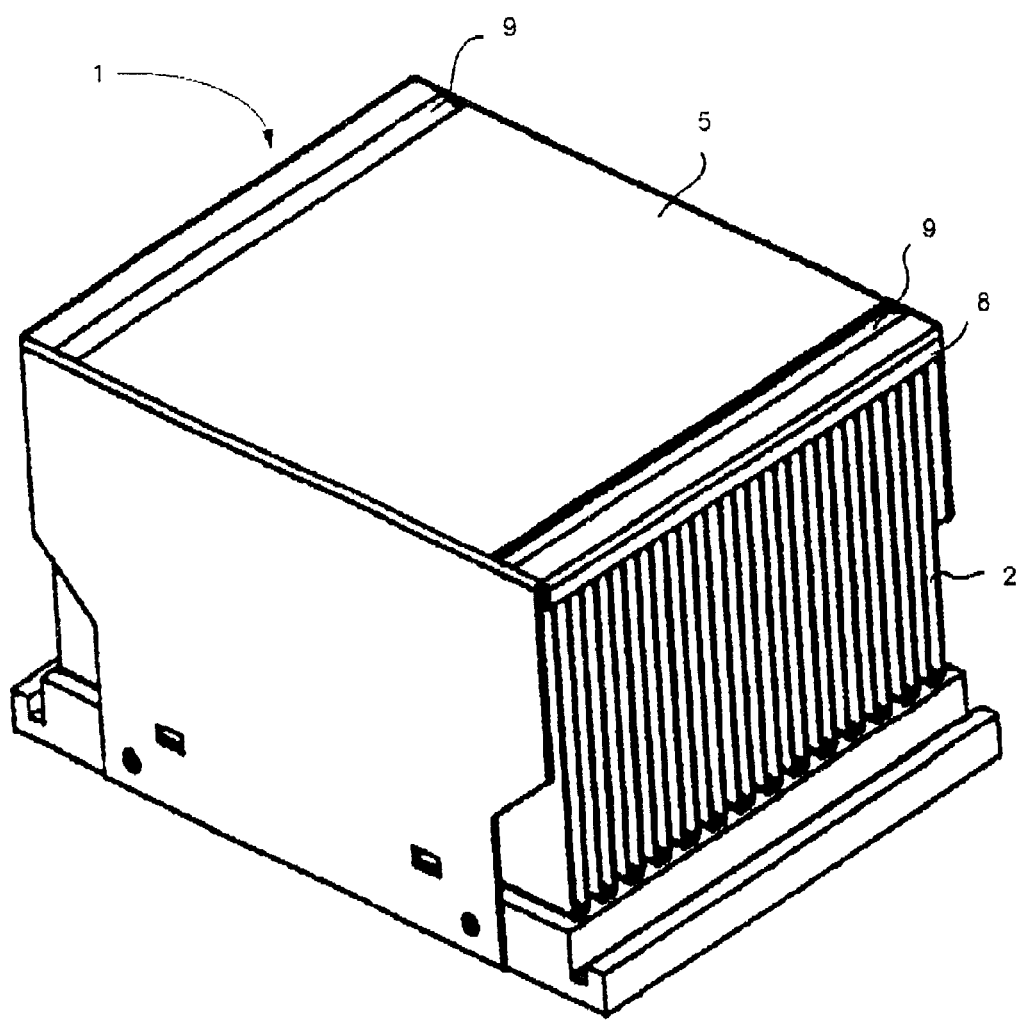
FIG. 6 is a front perspective view of an alternate embodiment of a passive folded-fin heat sink assembly construction with a singular folded-fin component and a singular shroud construction.

FIGS. 5 and 6 show alternative embodiments of a one-piece folded-fin assembly 2 and a one-piece shroud 5 located on a base plate 3, the shroud having folded-fin assembly positioning flanges 8 and downwardly extending flaps 9, to provide a folded-fin heat sink assembly 1.

The folded-fin heat sink assembly 1 is readily manufactured by standard mass-production techniques to provide a assembly having excellent joint integrity and a low likelihood of any individual fin being brazed or otherwise in contact with another.

Referring, for example, to FIG. 5, the folded fin heat sink assembly includes a base plate 3, a folded-fin assembly 2 mounted to the base plate and a shroud 5 mounted to the base plate. The shroud at least partially covers the folded-fin assembly 2. The side walls or panels 5a of the shroud are mounted parallel with the outermost fins of the folded-fin assembly 2 so that each side panel defines, in conjunction with a corresponding outermost fin, an airflow passage for ducting heated air from the base plate toward the top wall or panel 5b.

The shroud maintains the folded-fin assembly wider pressure against the base plate by pressing against the folded-fin assembly with downwardly extending flaps or other means. The shroud can be made of a thermally conductive material, such as aluminum or copper, so that it acts as an extension of the folded-fin heat sink and provides additional fin surfaces via which heat can be dissipated.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A method of manufacturing a folded-fin heat sink assembly, the method comprising:
    positioning a folded-fin assembly on a base plate;
    placing a shroud over a substantial portion of the folded-fin assembly with at least part of the shroud engaging the folded-fin assembly;
    urging the shroud towards the base plate to press the folded-fin assembly against the base plate for preventing movement of folded fins of said folded-fin assembly relative to the base plate and relative to each other, and securing the shroud to the base plate with tie folded-fin assembly under pressure; and
    bonding the folded-fin assembly to the base plate;
    wherein the shroud includes at least a top panel, side panels and means extending downwardly from the top panel;
    wherein securing the shroud to the base plate comprises securing the side panels to the base plate; and
    wherein engagement of the folded-fin assembly by the shroud comprises engagement of the folded fin assembly by the downwardly extending means for maintaining the folded-fin assembly under pressure against the base plate.

2. The method of claim 1, wherein opposite edges of the top panel between said side panels each have at least one downwardly extending flange along at least a part of said edges, the flanges capturing the folded-fin assembly therebetween to position the folded-fin assembly on the base plate.

3. The method of claim 2, wherein said means extending downwardly from the top panel comprises at least two spaced-apart flaps extending transversely over at least a part of the top panel between the side panels, and engagement of the folded-fin assembly by the shroud comprises engagement of the folded fin assembly by the flaps for maintaining the folded-fin assembly under pressure against the base plate.

4. The method of claim 3 wherein securing the shroud to the base plate comprises using a plurality of laser tack welds along an interface perimeter.

5. The method of claim 2 wherein securing the shroud to the base plate comprises using a plurality of laser tack welds along an interface perimeter.

6. The method of claim 1, wherein the side panels are provided with inwardly extending stop members engaging the base plate and limiting the amount of pressure exerted by the shroud upon the folded-fin assembly by limiting the extent of movement of the shroud towards the base plate.

7. The method of claim 6, wherein said means extending downwardly from the top panel comprises at least two spaced-apart flaps extending transversely over at least a part of the top panel between the side panels, and engagement of the folded-fin assembly by the shroud comprises engagement of the folded fin assembly by the flaps for maintaining the folded-fin assembly under pressure against the base plate.

8. The method of claim 7 wherein securing the shroud to the base plate comprises using a plurality of laser tack welds along an interface perimeter.

9. The method of claim 6 wherein securing the shroud to the base plate comprises using a plurality of laser tack welds along an interface perimeter.

10. The method of claim 1, wherein opposite edges of the top panel between said side panels each have at least one downwardly extending flange along at least a part of said edges, the flanges capturing the folded-fin assembly therebetween to position the folded-fin assembly on the base plate, and wherein the side panels are provided with inwardly extending stop members engaging the base plate and limiting the amount of pressure exerted by the shroud upon the folded-fin assembly by limiting the extent of movement of the shroud towards the base plate.

11. The method of claim 10, wherein said means extending downwardly from the top panel comprises at least two spaced-apart flaps extending transversely over at least a part or the top panel between the side panels, and engagement of the folded-fin assembly by the shroud comprises engagement of the folded fin assembly by the flaps for maintaining the folded-fin assembly under pressure against the base plate.

12. The method of claim 11 wherein securing the shroud to the base plate comprises using a plurality of laser tack welds along an interface perimeter.

13. The method of claim 10 wherein securing the shroud to the base plate comprises using a plurality of laser tack welds along an interface perimeter.

14. The method of claim 1, wherein said means extending downwardly from the top panel comprises at least two spaced-apart flaps extending transversely over at least a part of the top panel between the side panels, and engagement of the folded-fin assembly by the shroud comprises engagement of the folded fin assembly by the flaps for maintaining the folded-fin assembly under pressure against the base plate.

15. The method of claim 14 wherein securing the shroud to the base plate comprises using a plurality of laser tack welds along an interface perimeter.

16. The method of claim 1 wherein securing the shroud to the base plate comprises using a plurality of laser tack welds along an interface perimeter.

* * * * *